(12) United States Patent
Gaschke

(10) Patent No.: US 6,196,866 B1
(45) Date of Patent: Mar. 6, 2001

(54) VERTICAL PROBE HOUSING

(75) Inventor: Paul M. Gaschke, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/302,901

(22) Filed: Apr. 30, 1999

(51) Int. Cl.⁷ .................................................. H01R 13/00
(52) U.S. Cl. ............................................... 439/482; 439/66
(58) Field of Search ........................... 439/66, 482, 81, 439/289; 324/754, 761, 756

(56) References Cited

U.S. PATENT DOCUMENTS

| | | | |
|---|---|---|---|
| 3,806,801 | * 4/1974 | Bove | 439/482 |
| 4,027,935 | 6/1977 | Byrnes et al. | 439/289 |
| 4,523,144 | * 6/1985 | Okubo et al. | 324/158 |
| 5,320,559 | * 6/1994 | Uratsuji et al. | 439/482 |
| 5,399,982 | * 3/1995 | Driller et al. | 439/66 |
| 5,670,889 | * 9/1997 | Okubo et al. | 324/760 |

FOREIGN PATENT DOCUMENTS

1406829 * 6/1988 (SU) .............................. H05K/01/11

OTHER PUBLICATIONS

"Sub–1–V Swing Internal Bus Architecture for Future Low-Power ULSI's" by Y. Nakagome, IEEE Journal of Solid State Circuits, vol. 28, No. 4 (Apr., 1993).

* cited by examiner

Primary Examiner—Brian Sircus
Assistant Examiner—T. C. Patel
(74) Attorney, Agent, or Firm—James A. Lucas; Driggs, Lucas, Brubaker & Hogg Co., LPA

(57) ABSTRACT

A vertical probe for use in testing multiple chips carried on a wafer comprises a body of dielectric material having a testing surface and an output surface spaced from the testing surface. The dielectric body includes at least one chamber defining an opening in the output surface, and the rim of the opening is formed by a lip of the dielectric material. The device also includes multiple contacts which pass through the testing surface and which are snap fit in holes in the rim. A unibody construction for the dielectric body is described.

33 Claims, 4 Drawing Sheets

VERTICAL PROBE HOUSING

FIELD OF THE INVENTION

The present invention pertains to a test probe housing for contacting rows of densely spaced bonding pads such as memory devices on a wafer.

BACKGROUND OF THE INVENTION

Vertical probes are typically used to make electrical contact between the chip pads of chips carried on wafers and a testing system or machine used for device testing. The device chip pads are densely spaced, and the function of the vertical probe is to "fan-out" or enlarge this dense spacing to accommodate the larger spacing between adjacent electrical connectors found in most testing equipment.

A typical vertical probe is the cobra probe described in U.S. Pat. No. 4,027,935. This probe consists of upper and lower dies, a housing supporting the two dies, and multiple contacts formed from thin wire, e.g. 4 to 5 mils in diameter. The contacts are generally sharpened to a fine point, like a pencil point, for improving the ability of the probe tip to penetrate aluminum oxide on the chip pads. In addition, the contacts are mounted in the dies in a manner such that minor differences in the topography of different chip pads are accommodated by the inherent resiliency of the contacts.

SUMMARY OF THE INVENTION

The present invention is directed to an improvement over known vertical probes wherein the die/housing assembly forming the basic structure for supporting the contacts is replaced by a single, unitary body. With this structure, the inventive vertical probe is easier to manufacture than vertical probes of current design. Moreover, repair of the inventive vertical probe is also easier, since the basic structure of the probe need not be disassembled to achieve access to the device interior for replacing broken contacts.

Thus, the present invention provides an improved vertical probe for use in testing multiple chips carried on a wafer comprising a unibody of dielectric material having a testing surface and an output surface spaced from the testing surface. The body includes at least one chamber defining an opening in the output surface, the rim of the opening being formed by a lip of the dielectric material. The device also includes a testing wall between the testing surface and the chamber. Multiple contacts, each having a distal end with a tip for contacting one of the pads, are received in the respective holes in the testing wall. Each contact has an output end opposite the distal end.

The invention also deals with means for providing ready access to the interior of the probe to facilitate the loading of contacts and also the removal and replacement of faulty contacts. More specifically, the invention comprises a probe for probing a plurality of chip pads. The probe comprises a contact and a first die, the die having a first surface containing a first hole with a contact extending at least part way through the first hole. An opening in the surface in proximity to the first hole accesses a chamber within the probe thereby permitting the contact to be loaded into the first hole. Typically, the first die is an upper die of a probe useful for vertical probing. The probe also includes a lower die comprising a surface containing a second hole offset from the first hole. The contact slidably extends through the second hole and provides a spring force for contacting a substrate, e.g. a chip pad, facing the second hole. The probe may comprise a plurality of contacts arranged to test a plurality of chips. The first and second dies can be fabricated from a single piece of material or can be produced from separate subcomponents which are then assembled with a midplate into the probe body. The probe further comprises a dielectric film adjacent the contact to prevent shorting and to facilitate sliding of the distal end of the contact in the second hole. The dielectric film preferably comprises a polyimide film having a thickness between about 2 mils and 5 mils. The opening through the first die preferably is sized to accommodate one or more decoupling capacitors.

DETAILED DESCRIPTION

Figure 1:
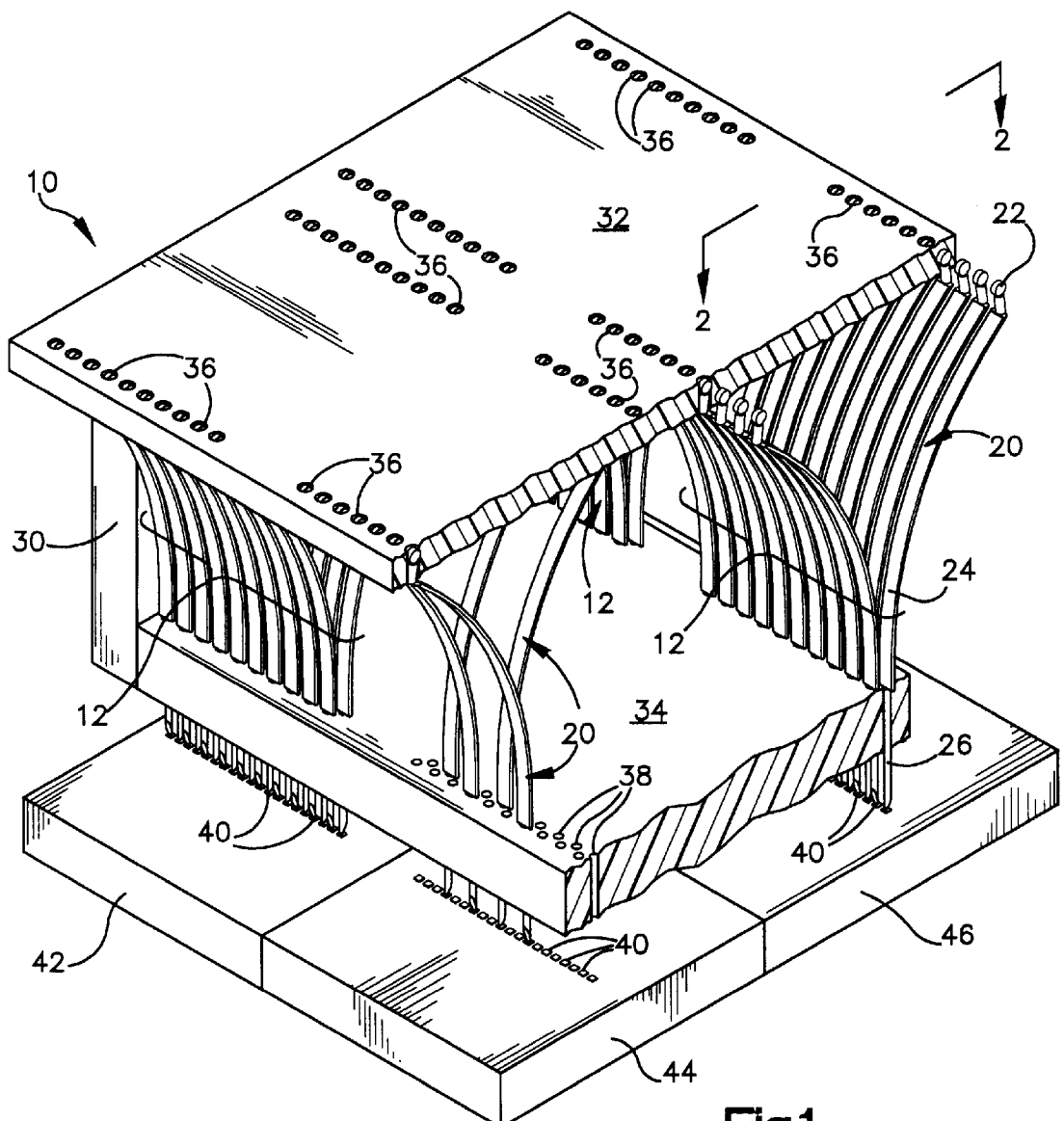
FIG. 1 is a schematic isometric view of a prior art cobra probe with offset tips.

FIG. 1 illustrates at 10 a prior art quad multi-DUT (Device Under Test) probe assembly, i.e. a prior art cobra probe for testing four separate electronic devices. Probe 10 includes four arrays 12 of contacts 20, each contact 20 being formed from a single piece of wire having a diameter in the range of about 100 to 125 microns. In addition, each contact 20 comprises a swaged head 22 pivotally mounted in a hole 36 of upper die 32 of probe 10, a curved body 24, and a cylindrical shank 26 mounted in hole 38 in lower die 34 of probe 10 and terminating in an offset tip. Since head 22 is not collinear with its shank 26, each contact 20 is constrained against rotation.

Vertical probe 10 is provided for effecting electrical contact between chip pads 40 of devices 42, 44, 46 to be tested and testing equipment (not shown). Chip pads 40 are typically about 100 microns square and are arranged in densely spaced rows in the center of the devices to be tested with center-to-center spacings or pitch on the order of about 150 microns. As illustrated in FIG. 1, contacts 20 serve to "fan out" or enlarge this dense spacing to accommodate the larger spacing between adjacent electrical connectors found in the testing equipment to which devices 42, 44 and 46 will be connected.

As illustrated in FIG. 1, the superstructure of prior art probe assembly 10 is composed of three separate parts, upper die 32, offset lower die 34 and housing 30 on which both dies are mounted. Typically, dies 32 and 34 are mounted to the housing 30 by means of screws or other attaching means. From time to time, one or more of contacts 20 becomes worn out or broken, and it would be desirable to replace the faulty contacts by a simple operation. However, replacing contacts 20 in probe 10 can be difficult, because the upper die 32 must typically be removed from housing 30 to accomplish this repair.

In accordance with one embodiment of the present invention, replacement of faulty contacts is facilitated by forming the superstructure of the probe from a unitary body and providing access to the individual contacts through an opening in an upper surface of the superstructure.

Figure 2:
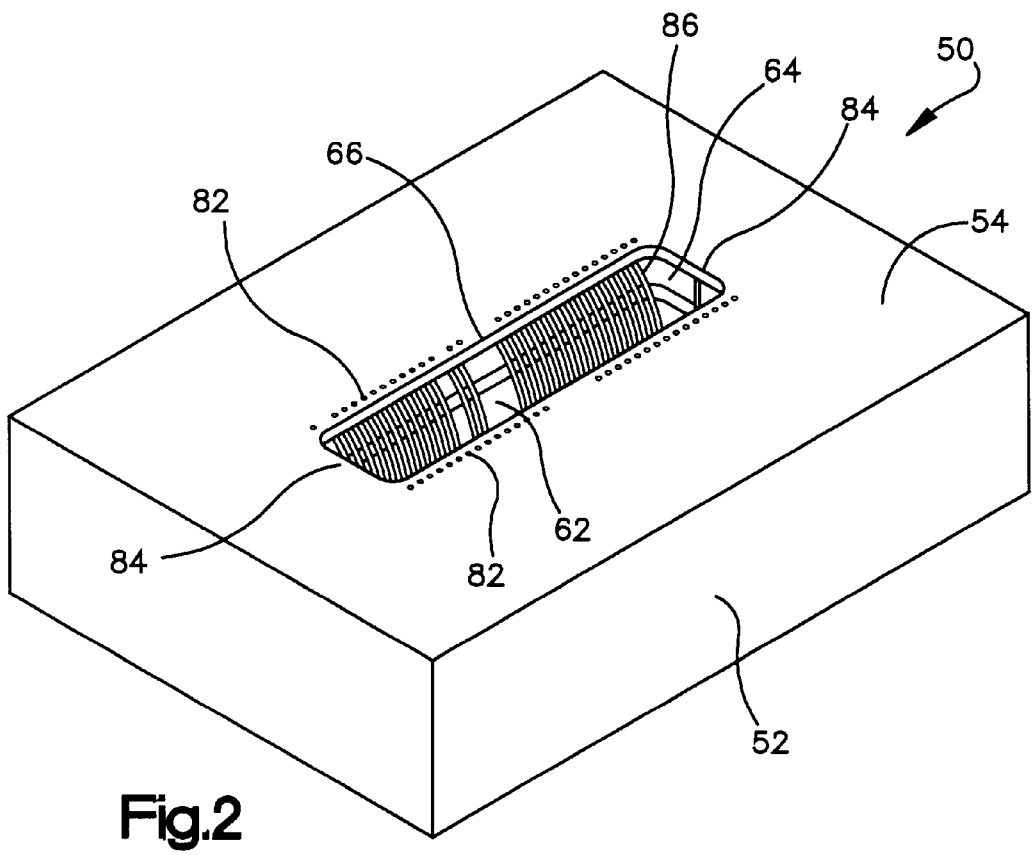
FIG. 2 is a schematic isometric view of the inventive vertical probe.
Figure 3:
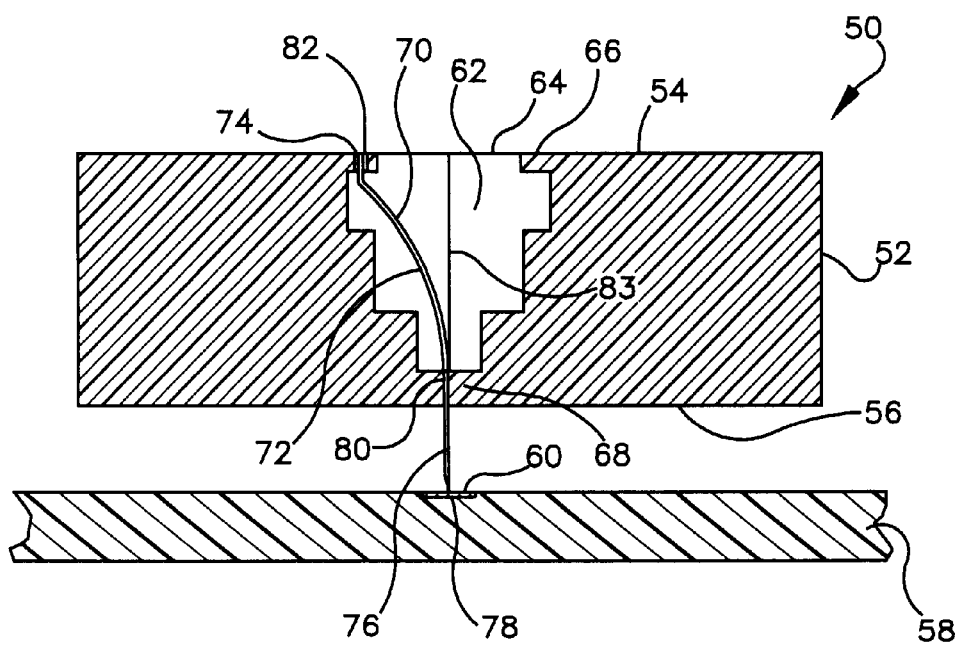
FIG. 3 is a sectional view of the inventive vertical probe of FIG. 2.

This is more fully illustrated in FIGS. 2 and 3 which show the inventive vertical probe, generally indicated at 50, being formed from a unitary body or "unibody" 52 composed of a unitary mass of dielectric material. The unibody 52 defines an upper or output surface 54 and a testing surface 56 spaced therefrom which is adapted to face a wafer 58 carrying multiple chips to be tested (not shown), each of which has one or more chip pads 60 for electrical connection.

In accordance with the invention, a chamber 62 is provided in unibody 52, chamber 62 forming an opening 64 in output surface 54. Chamber 62 is undercut adjacent output surface 54 so that lip 66 is formed at opening 64 from the dielectric material forming unibody 52. Chamber 62 also extends towards testing surface 56 such that testing wall 68 is formed in unibody 52 by testing surface 56 and chamber 62. In the particular embodiment shown, lip 66 is 0.015 inches (0.38 mm) thick, while testing wall 68 is 0.030 inches (0.76 mm) thick.

In order to provide electrical connection, the inventive vertical probe 50 is provided with multiple contacts 70, only one of which is shown in FIG. 3. Contact 70 has the same structure as contacts 20 of FIG. 1 and is composed of curved body 72, swaged head 74 and distal end 76 defining tip 78 for contacting chip pad 60. Distal end 76 is slidably mounted in hole 80 defined in testing wall 68, while swaged head 74 is carried in hole 82 defined in lip 66.

In accordance with the invention, contact 70 is fit in hole 80 and snap fit into lip hole 82. In particular, contact 70 is mounted in place by first inserting distal end 76 into hole 80 and then bending the contact enough to insert swaged head 74 into opening 64 of unibody 52 and then into lip hole 82 in the underside of lip 66. Because of its inherent resiliency, contact 70 will snap into place, and will be held in place, once swaged head 74 is put into lip hole 82. Moreover, once it wears out, contact 70 can be easily removed simply by following a reverse procedure. It will therefore be appreciated that replacement of defective contacts can be accomplished very easily, since disassembly of the probe superstructure may be avoided.

In the embodiment illustrated in FIGS. 2 and 3, unibody 52 is formed from a single block of Macor (a commercially available machineable ceramic) which is machined to form chamber 62 therein. Unibody 52 can be made from any other suitable dielectric material such as other ceramics (e.g. Delrin, Vespel), various plastics and other rigid materials having dielectric properties. Furthermore, chamber 62 can be formed in unibody 52 by any desired means including subsequent machining of a preformed part or by molding or other shaping operation. Similarly, although unibody 52 is preferably made from a single piece or mass of material, it can also be made from multiple pieces of material which are secured together, before or after formation of chamber 62, either permanently or on a temporary basis. In any event, regardless of how unibody is made, what is important in accordance with one aspect of the present invention is that unibody 52 have a configuration that allows access to its interior without disassembling the part or parts forming testing wall 68 and lip 66.

Although FIG. 3 shows only one contact 70, in actual practice the inventive vertical 15 probe will have multiple contacts for making electrical contact with multiple chip pads 60 on the device being tested. In particular, vertical probe 50 will typically include an array of contacts arranged in two opposed rows in the same way as contacts 20 are arranged in the prior art device illustrated in FIG. 1. See FIG. 2 which shows one row 86 of contacts 70. In such an arrangement, the distance between the opposing rows of contacts is greater at lip 66 than at testing wall 68. By this means, the array of contacts "fans out" or enlarges the dense spacing of device chip pads 40 to accommodate the larger spacing between adjacent electrical connectors found in most testing equipment.

In a preferred embodiment of the invention, a separator template is located between adjacent rows of contacts 70 in vertical probe 50. This is illustrated in FIG. 3, which shows separator template 83 adjacent the contact 70. Separator template 83 is composed of a sheet of dielectric material which extends on its bottom to, at or near testing wall 68 and at its top to lip 66. Preferably, separator template 83 extends along the entire length of the rows of contacts 70 and is received under lip 66 at the opposite ends of the opening 64. By this means, the separator template is secured in place against accidental dislodgment. Separator template 83 prevents stationary contacts 70 from touching one another and thereby allows closer spacing of adjacent rows. Also, separator template 83 prevents contacts from touching one another during insertion and removal and thereby facilitates easy replacement of defective contacts.

Figure 4:
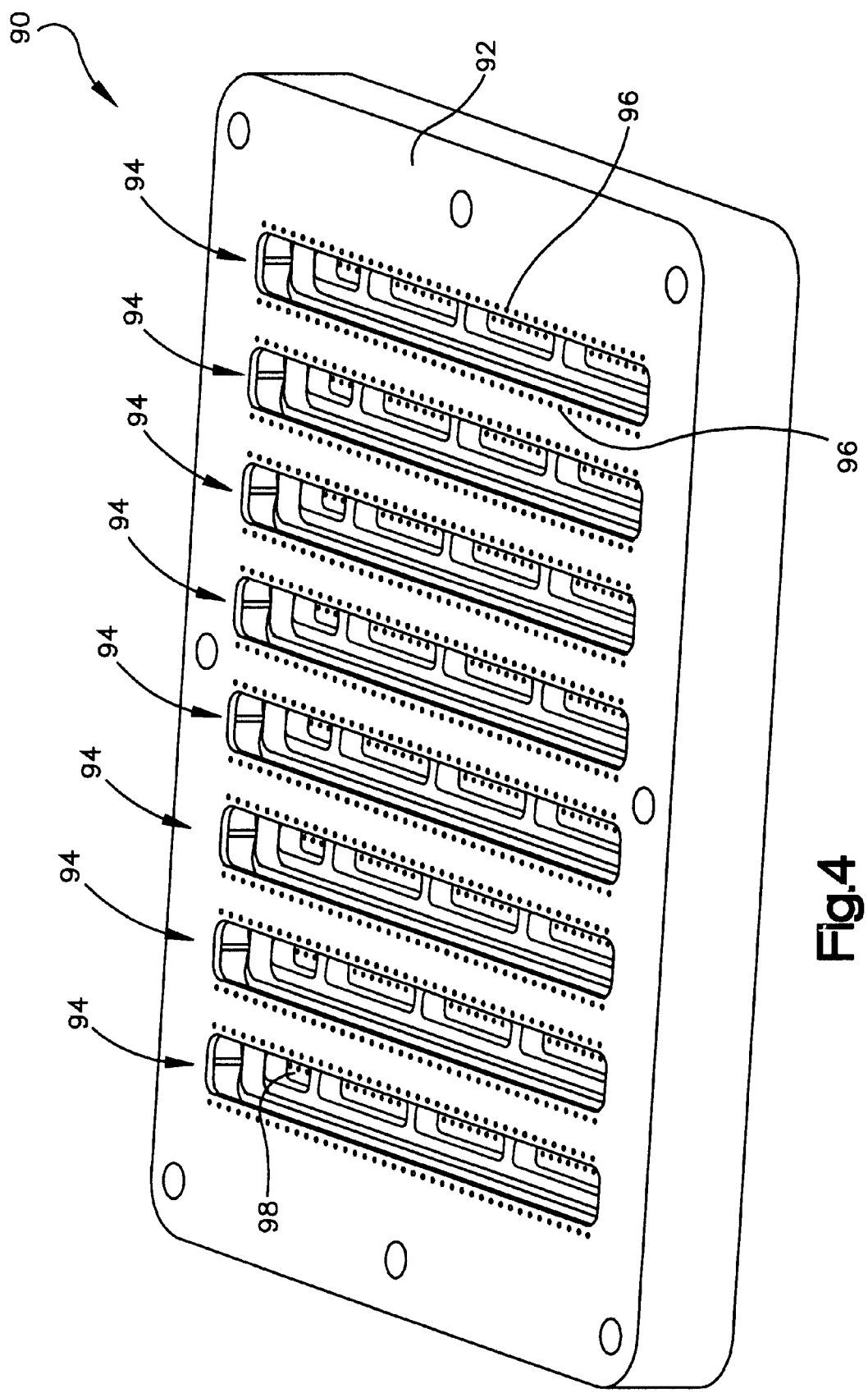
FIG. 4 is a schematic isometric view similar to FIG. 2 illustrating another vertical probe of the present invention provided for simultaneously testing 32 separate devices.

FIG. 4 illustrates another vertical probe made in accordance with the present invention adapted for simultaneous testing of 32 separate electronic units or devices. This contact, generally indicated at 90, is also composed of a single unibody 92 made from a unitary mass of dielectric material, in particular machineable ceramic. Unibody 92 defines multiple testing chambers 94, each of which contains multiple lip holes 96 arranged in two rows, parallel to one another and also parallel to the rows of lip holes in the other chambers as well. In addition, each chamber defines multiple (specifically, four) separate testing walls 98 which are aligned along the rows of contacts in that chamber. With this configuration, vertical probe 90 defines an array of testing walls adapted to test 32 separate devices arranged in a 4×8 grid.

Figure 5:
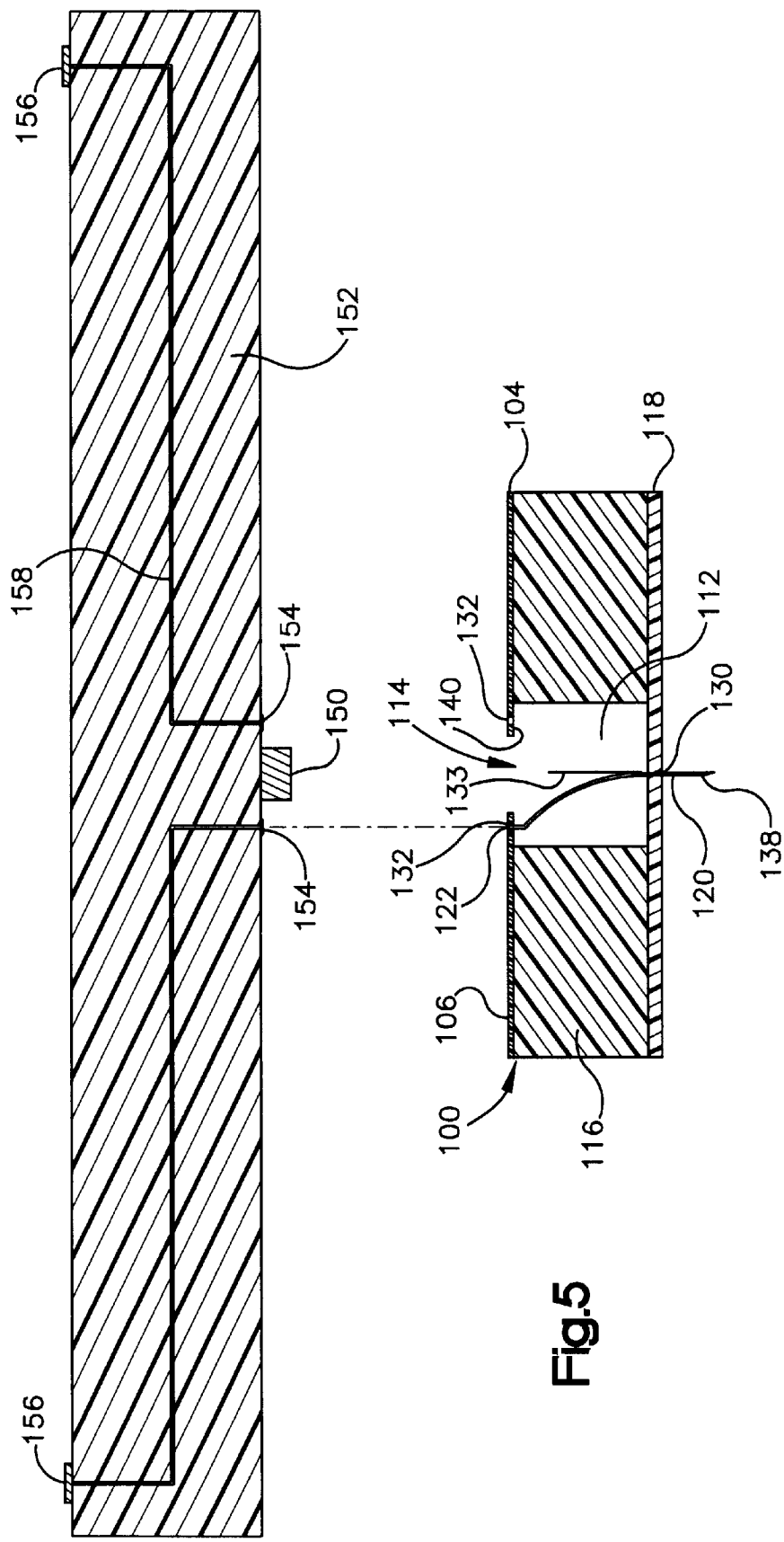
FIG. 5 is a schematic view showing yet another vertical probe of the present invention showing an electrical fanout.

Turning now to FIG. 5, there is shown a head 100 of a vertical probe, said head comprising an upper die 104 and a lower die 118 joined together by a midplate 116. The upper die comprises a contact surface 106 and has an opening 114 that communicates with a chamber 112 extending through the midplate 116 of the vertical probe 100. The opening 114 through the upper die 104 is smaller than the chamber through the midplate 116, thereby forming an overhanging lip 140. A contact 120 is positioned in the chamber 112 with an upper swaged head 122 extending through a hole 132 in the lip 140. The distal end of the contact 120 extends through a second hole 130 in the lower die 118 terminating in offset tip 138. The contact is free to slide within the second hole 130 which is offset from the first hole 132, and is curved thereby forming a spring force. This enables the tip 138 of the contact to engage a substrate such as a pad to be tested (not shown).

Spaced above the contact 100 and in registry therewith is a fanout 152 including a decoupling capacitor 150 and a plurality of test pads 154 (two of which are shown). The test pads 154 are adapted to move into contact with the surface 106 as the electrical fanout 152 is shifted into registry with the upper die 104 of vertical probe 100. The test pads 154 are joined to tester connects 156 by wires 158.

When the test probe includes a plurality of contacts 120, a separator plate 133, typically comprising a dielectric barrier such as a thin sheet of polyimide film is used to prevent electrical contact, and consequent shorting, between adjacent contacts. The film also facilitates sliding of the contact 120 through the second hole 130.

A defective contact can be readily replaced by accessing the vertical probe of FIG. 5 through the opening 114 in the upper die 104 and into the chamber 112, removing the swaged head 122 from the bole 132 in the upper die, and slidably removing the distal end 138 from the hole 130 in the lower die 118. The configuration of this contact 100 provides ready access to the interior of the test probe to facilitate the removal and replacement of faulty contacts 120.

It is understood that the vertical probes shown in FIGS. 2–4 are also intended to be used with a fanout of the type shown in FIG. 5. The fanout is of conventional construction, and is not deemed to comprise or be a part of the present invention.

The present invention provides a simple yet elegant design for a vertical contact which eliminates the need to disassemble the probe superstructure for replacing worn or faulty contacts. Because of its simple design, it is easy and less expensive to manufacture. Yet it can be easily expanded to accommodate simultaneous handling of large numbers of devices, thereby reducing the overall cost of device testing.

Although only a few embodiments of the present invention have been described above, it should be appreciated that many modifications can be made without departing from the spirit and scope of the invention. For example, although the contacts in adjacent rows have been shown oppose one another where they cross the testing wall 98, they can also be arranged in an interleaved (or overlapping) relationship at this location for facilitating a tighter pitch. Similarly, the tips on the distal ends of contacts 70 can be asymmetrically located such as, for example, in the manner of hypodermic syringe needles which will also allow tighter pitch. This development is described in commonly assigned application Ser. No. 09/026,382, filed Feb. 19, 1998, the disclosure of which is incorporated herein by reference. All such modifications are intended to be included within the scope of the present invention, which is to be limited only by the following claims:

What is claimed is:

1. A vertical probe for use in testing one or more chips, comprising a dielectric housing of a unitary mass of material having a testing surface and an output surface spaced from said testing surface, said mass including at least one chamber defining an opening in said output surface, the opening having a rim, the rim of said opening being formed by a lip of said dielectric material, said unitary mass also forming a testing wall between said testing surface and said chamber, and a plurality of contacts each having a distal end with a tip for contacting a chip pad and an output end opposite said distal end, the distal end of each probe being received in a hole in said testing wall, the output end of each probe being received in a hole in said lip.

2. The vertical probe of claim 1, wherein said contacts are resilient, and wherein each of said probes is snap fit in said unitary mass.

3. The vertical probe of claim 1, wherein said contacts are arranged in at least one array, the probes in each array being arranged in two opposed rows, the distance between the rows being greater at said lip than at said testing wall.

4. The vertical probe of claim 3, further comprising a separator plate formed from a dielectric material arranged between said two opposed rows.

5. The vertical probe of claim 1, wherein said housing defines multiple chambers each chamber supporting a plurality of contacts.

6. The vertical probe of claim 5, wherein the contacts in said multiple chambers are arranged in parallel rows.

7. The vertical probe of claim 6, wherein each of said chambers defines multiple testing walls for testing of multiple chips, each testing wall receiving a plurality of contacts having distal ends arranged in two common parallel rows.

8. The vertical probe of claim 1, wherein said chamber defines multiple testing walls for testing of multiple chips, each testing wall receiving a plurality of contacts.

9. The vertical probe of claim 8, wherein the contacts in said chamber are arranged in two, common, parallel rows, the distance between the rows being greater at said lip than at said testing walls.

10. The vertical probe of claim 1, wherein the spacing between the holes in said lip is greater than the spacing between the holes in said testing wall.

11. The vertical probe of claim 10, wherein said dielectric material is a ceramic.

12. The vertical probe of claim 11, wherein said ceramic is machinable.

13. The vertical probe of claim 12, wherein said chamber is larger adjacent said opening than at said testing wall.

14. A probe for use in testing one or more chips carried on a wafer, each of said one or more chips having one or more chip pads such that said pads in the aggregate form an array of spaced chip pads arranged essentially in a common plane, said probe comprising:

a body of dielectric material defining a testing surface for approaching said array of spaced pads and an output surface spaced from said testing surface, said body defining at least one chamber defining an opening in said output surface, said opening having a rim, the rim of said opening being formed by a lip of said dielectric material, said testing surface and said chamber defining therebetween a testing wall, said lip and said testing wall each containing holes therein for receiving contacts, said holes arranged in pairs, one hole of each pair being formed in said lip and the other hole of said pair being formed in said testing wall, and a plurality of contacts, each contact having a distal end having a tip for contacting one of said pads and an output end opposite said distal end, the distal end of each probe being received in a hole in said testing wall, the output end of each probe being received in a hole in said lip.

15. A vertical probe for use in testing one or more chips carried on a wafer comprising a body of dielectric material having a testing surface and an output surface spaced from the testing surface, the body including at least one chamber defining an opening in the output surface, said opening having a rim, the rim being formed by a lip of dielectric material, said vertical probe also including multiple contacts passing through said testing surface said contacts being snap fit into holes in said rim.

16. A unibody for use in forming a vertical probe, said vertical probe to be used for testing one or more chips carried on a wafer, each of said chips having one or more chip pads such that said chips in the aggregate form an array of densely spaced chip pads arranged essentially in a common plane, said chip pads to be electrically connected to connectors on a testing machine during said testing, said unibody comprising a unitary mass of dielectric material having a testing surface and an output surface spaced from said testing surface, said mass including at least one chamber defining an opening in said output surface, said opening having a rim, said rim being formed by a lip of said dielectric material, said mass also forming a testing wall between said testing surface and said chamber, said lip and said testing wall each containing holes therein for receiving multiple contacts, said holes being arranged in pairs, one hole of each pair being formed in said lip and the other hole of said pair being formed in said testing wall, the spacing between the holes in said lip being greater than the spacing between the holes in said testing wall whereby said contacts when received in said holes can fan out the dense spacing of said chip pads for electrical connection thereof to the connectors on said testing machine.

17. A vertical probe for vertical probing, comprising a contact and a die, said die having a first surface, said first surface including a first hole, said contact extending at least part way through said first hole, said first surface further including an opening proximate to said first hole, said opening for loading said contact in said first hole.

18. A vertical probe as recited in claim 17, wherein said die is an upper die.

19. A vertical probe as recited in claim 17, further including a lower die, said lower die comprising a second surface and containing a second hole, said second hole offset from said first hole, said contact extending through said second hole wherein said contact is free to slide within said second hole, said contact providing a spring force for contacting a substrate facing said second hole.

20. A vertical probe as recited in claim 17, wherein said die further comprises a second surface opposite said first surface, said second surface containing a second hole, said second hole offset from said first hole, said contact extending through said second hole wherein said contact is free to slide within said second hole, said contact providing a spring force for contacting a substrate facing said second hole.

21. A vertical probe as recited in claim 17, wherein said opening is also for accommodating a decoupling capacitor.

22. A probe as recited in claim 17, wherein said contact is free to slide within said first hole, said contact providing a spring force for contacting a test system facing said first hole.

23. A vertical probe as recited in claim 17, wherein said contact has a feature to prevent it from falling entirely through said first hole.

24. The vertical probe of claim 23 wherein this feature is a swaged head.

25. A probe as recited in claim 17, further comprising a plurality of contacts.

26. A probe as recited in claim 25 wherein said contacts are arranged for testing a plurality of integrated circuits.

27. A probe as recited in claim 17, further comprising a dielectric film adjacent said contact to prevent shorting and to facilitate sliding in said second hole.

28. A probe as recited in claim 27, wherein said film comprises polyimide.

29. A probe as recited in claim 28, wherein said polyimide film has a thickness in the range from about 2 mils to about 5 mils.

30. A vertical probe for vertical probing, comprising a contact and a die, said die having a first surface, said first surface including a first hole, said contact extending at least part way through said first hole, said first surface further including an opening proximate to said first hole, said opening for loading said contact in said first hole, said die further comprises a second surface opposite said first surface, said second surface containing a second hole, said second hole offset from said first hole, said contact extending through said second hole wherein said contact is free to slide within said second hole, said contact providing a spring force for contacting a substrate facing said second hole said first surface and said second surface are both part of a single piece of material.

31. A vertical probe as recited in claim 30 further comprising a chamber extending between said first hole and said second hole.

32. A vertical probe as recited in claim 31, wherein said opening in said first surface exposes said chamber.

33. A vertical probe as recited in claim 32, wherein said opening is narrower than said chamber to expose a lip, said first hole extending through said lip.

* * * * *